US006887756B2

(12) United States Patent
Hsu

(10) Patent No.: US 6,887,756 B2
(45) Date of Patent: May 3, 2005

(54) METHOD OF FORMING FLASH MEMORY WITH PROTRUDED FLOATING GATE

(75) Inventor: Scott Hsu, Yunlin Hsien (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 239 days.

(21) Appl. No.: 10/158,927

(22) Filed: Jun. 3, 2002

(65) Prior Publication Data

US 2003/0100157 A1 May 29, 2003

(30) Foreign Application Priority Data

Nov. 28, 2001 (TW) .......................................... 90129410

(51) Int. Cl.⁷ ............................................ H01L 21/336
(52) U.S. Cl. ...................................... 438/257; 438/593
(58) Field of Search .......................... 438/257, 258–265, 438/296, 315, 593

(56) References Cited

U.S. PATENT DOCUMENTS 6,171,909 B1    1/2001  Ding et al.
6,498,064 B2 * 12/2002  Tseng .......................... 438/257

* cited by examiner

Primary Examiner—Phuc T. Dang
(74) Attorney, Agent, or Firm—Intellectual Property Solutions, Incorporated

(57) ABSTRACT

A method of forming a flash memory with a protruded floating gate. A substrate is provided. An isolation area and a plurality of patterned conductive layers are sequentially formed on the substrate. The isolation area protrudes from the upper surface of the substrate to isolate the patterned conductive layers. A photo resist layer is formed on the patterned conductive layer. The present invention also provides a flash memory with a protruded floating gate comprised a substrate, a plurality of protruded floating gates, an insulator, and a control gate.

3 Claims, 4 Drawing Sheets

METHOD OF FORMING FLASH MEMORY WITH PROTRUDED FLOATING GATE

BACKGROUND OF THE INVENTION

1. Field of the Invention

The present invention relates to a flash memory, and more particularly, to a flash memory with a protruded floating gate that increases the life of the flash memory.

2. Description of the Prior Art

High-density nonvolatile memory devices have been receiving much attention for application in many fields. One of the most important factors is the low cost of the reduced size of each memory cell. However, it is very difficult to shrink the cell size in the fabrication of nonvolatile memory cells when the conventional local oxidation (LOCOS) isolation technique is used. The isolation structure formed by this technique has a very large dimension and thus limits the miniaturization of the memory cells.

Another isolation technique called shallow trench isolation (STI) has been introduced to the fabrication of nonvolatile memory devices to reduce the cell size. The conventional field oxides are replaced by STI structures so that the device integration can be effectively improved. However, as component dimensions continue to shrink, the surface area of floating gates also shrinks. This leads directly to a decrease in capacitance of the effective capacitor formed between the floating gate layer and the control gate layer. This decrease in effective capacitance results in a reduction of the capacitive coupling ratio, which is a parameter that describes the coupling to floating gate of the voltage applied to control gate. The poorly-coupled voltage to floating gate limits the programming and accessing speed characteristics of the memory device.

The capacitive coupling ratio Cp is defined by:

$$Cp = \frac{Ccf}{Ccf + Cfs}$$

where Ccf is capacitance between the control gate and the floating gate; and Cfs is capacitance between the floating gate and the semiconductor substrate.

In order to improve programming and accessing speeds in nonvolatile memories, many attempts have been made to increase the coupling ratio. It can be understood from the above equation that when the capacitance Ccf between the control gate and the floating gate increases, the coupling ratio Cp increases. Therefore, the coupling ratio Cp is generally increased by increasing the capacitor area between the floating gate and control gate, which increases the capacitance Ccf, and therefore the coupling ratio Cp. For example, U.S. Pat. No. 6,171,909 discloses a method for forming a stacked gate of a flash memory cell. The coupling ratio of the stacked gate is increased by forming a conductive spacer. The conductive spacer, which is a portion of the floating gate, increases the capacitor area between the floating gate and control gate.

As shown in FIG. 1a, a conventional flash memory is comprised of a substrate 101, a gate oxide 104 forming on the substrate 101, a floating gate 105 forming on the gate oxide 104, a inter-gate oxide 106 forming on the floating gate 105, and a control gate 107 forming on the inter-gate oxide 106, wherein the substrate 101 has a source 102 and a drain 103. Traditionally, a high voltage is applied to the control gate 107 of the flash memory, and the electrons from the source 102 are injected into the floating gate 105 through the gate oxide 104. This programs the flash memory, e.g. writing information the flash memory, as shown in FIG. 1a.

A erase is performed when a low voltage or no voltage is applied to the control gate 107 of the flash memory, and a high voltage is applied to the source 102, so that the electrons are injected into the source 102 through the gate oxide 104 thus erasing the flash memory.

When the flash memory is both programmed and erased, the electrons tunnel through the gate oxide 104. The gate oxide 104 is a thin layer, so that the gate oxide 104 is damaged after repeating several programming and erasing operations.

SUMMARY OF THE INVENTION

In the present invention, a nonvolatile semiconductor memory device with an increased coupling ratio is disclosed. This is accomplished by providing a reduced size floating gate which reduces the capacitance Cfs between the floating gate and the semiconductor substrate. The effect is the same as increasing the capacitance Ccf between the control gate and the floating gate.

Accordingly, the object of the present invention is to provide a flash memory with protruded floating gate and method for forming the same. This increases the life of the flash memory by allowing for a novel way of erasing, and increases the access rate by improving the capacitive coupling ratio of the flash memory by increasing the surface area.

The present invention provides a method for forming a flash memory with a protruded floating gate. At first, a substrate is provided. An isolation area and a plurality of patterned conductive layers are sequentially formed on the substrate. The isolation area protrudes from the upper surface of the substrate to isolate the patterned conductive layers. A plurality of photo resist layer is formed on the patterned conductive layer. The surface areas of the photo resist layer are smaller than those of the patterned conductive layers. The patterned conductive layers are isotropically etched to form a protruded floating gate. The photo resist layer are removed. Then, an insulator and a control gate are sequentially formed on the substrate.

The present invention also provides a flash memory with protruded floating gate comprising a substrate, a plurality of protruded floating gates, an insulator, and a control gate. The substrate has an isolation area. The plurality of protruded floating gates is formed on the substrate and isolated by the isolation area. The insulator is formed on the surfaces of the substrate and the floating gate. The control gate is formed on the insulator.

BRIEF DESCRIPTION OF THE DRAWINGS

The present invention will become more fully understood from the detailed description given herein and the accompanying drawings, given by way of illustration only and thus not intended to be limited of the present invention.

DETAILED DESCRIPTION OF THE INVENTION

Figure 1A:
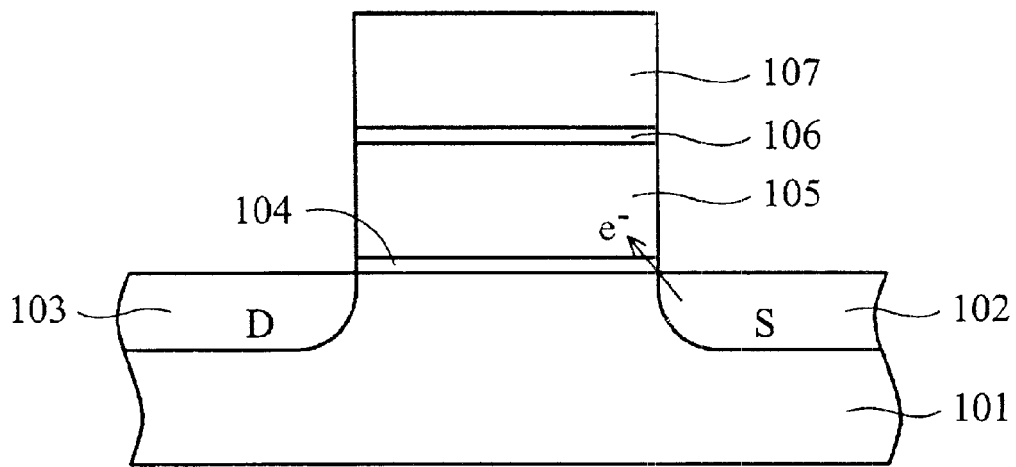
FIG. 1a depicts a conventional programming operation of the flash memory.
Figure 1B:
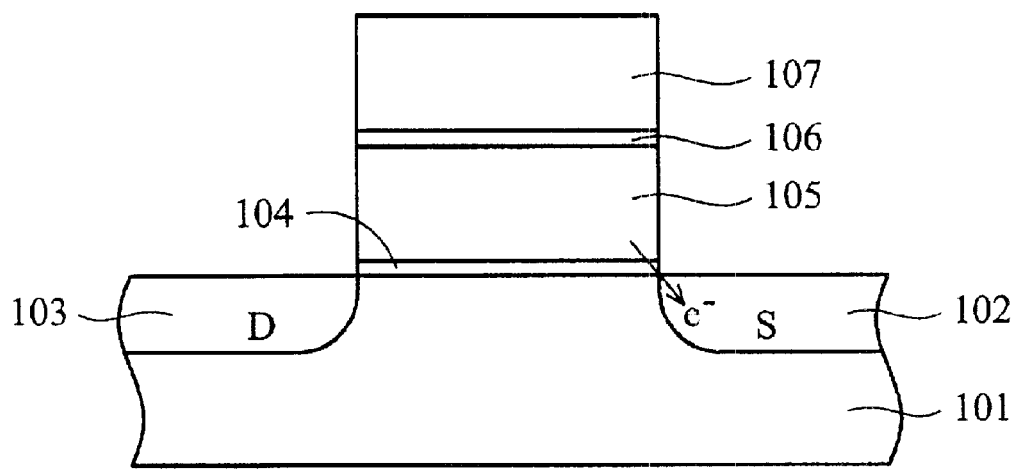
FIG. 1b depicts a conventional erasing operation of the flash memory.
Figure 2A:
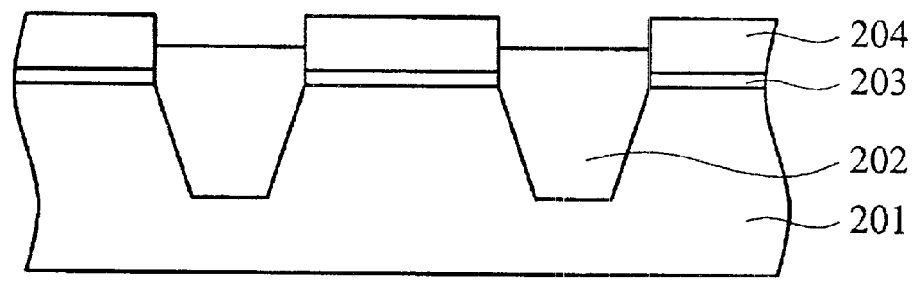
FIGS. 2a to 2d depict the method of forming the flash memory with protruded floating gate of the present invention.
Figure 2B:
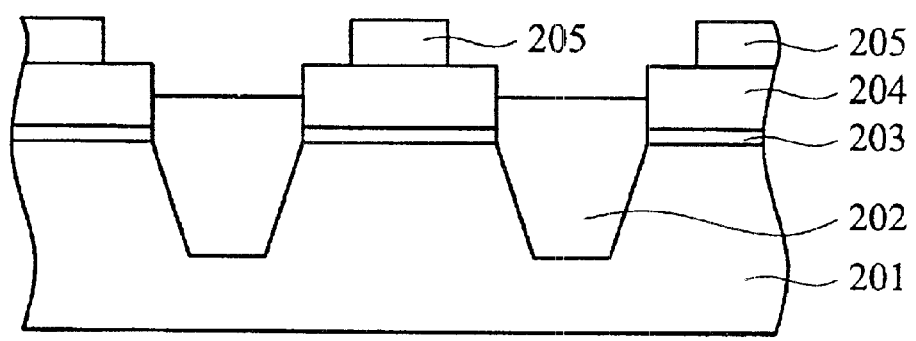

A detail description of the method of forming the flash memory with protruded floating gate of the present invention is given hereafter with reference to FIGS. 2a to 2b.

In FIG. 2a, a substrate 201 is provided. The substrate 201 has an isolation area 202. A plurality of gate oxide 203 is formed on the substrate 201. A plurality of patterned conductive layers 204 is formed on the gate oxide 203, and the isolation area 202 protrudes from the upper surface of the substrate 201 to isolate the patterned conductive layers 204. The isolation area 202 may be a Shallow Trench Isolation (STI).

With reference to FIG. 2b, the photo resist 205 is formed on the patterned conductive layers 204 after the patterned conductive layers 204 are formed on the substrate 201. The surface area of the photo resist layer 205 is smaller than those of the patterned conductive layers 204.

Figure 2C:
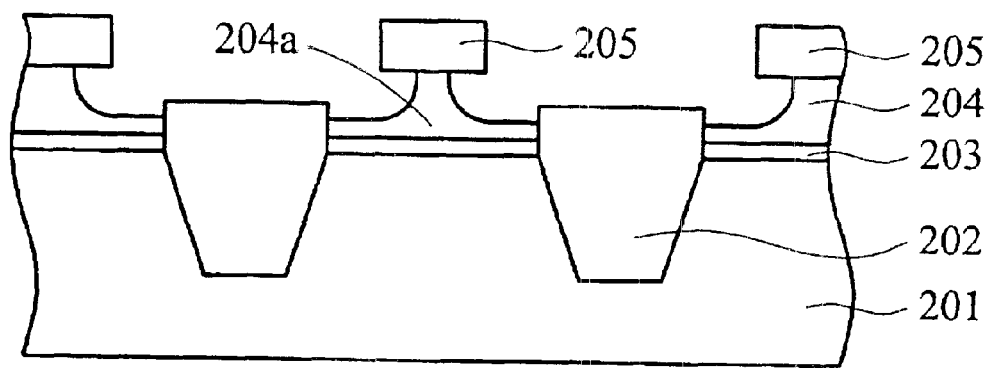

As shown in FIG. 2c, the patterned conductive layers 204 are isotropicaly etched with etchant using the photo resist layer 205 as a mask, and the photo resist layer 205 is removed to form the patterned conductive layers 204 is to a protruded floating gate 204a. The protruded floating gate 204a is tip-shaped or plateau-shaped.

Figure 2D:
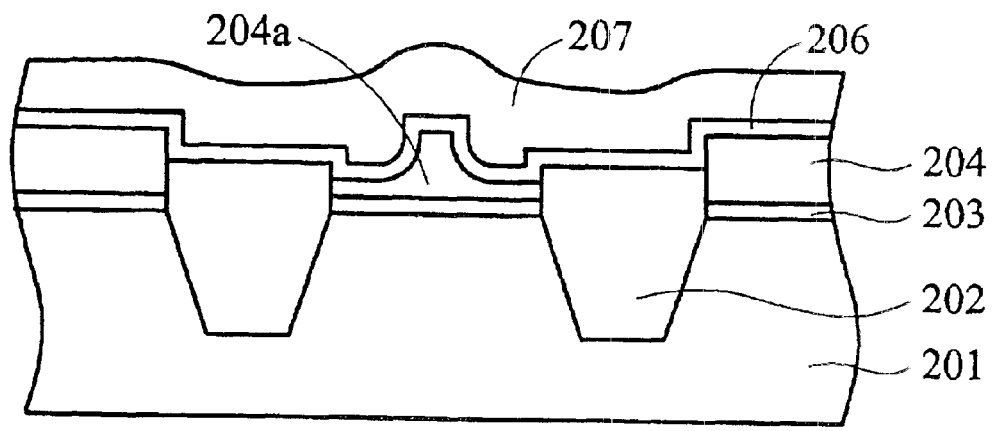

Then, as shown in FIG. 2d, an insulator 206 and a control gate 207 are sequentially formed on the substrate 201, wherein the protruded floating gate 204a and insulation layer 202 are on the substrate 201. For example, the insulator 206 is inter-gate oxide. Thereby, the flash memory with the protruded floating gate is formed.

Figure 3A:
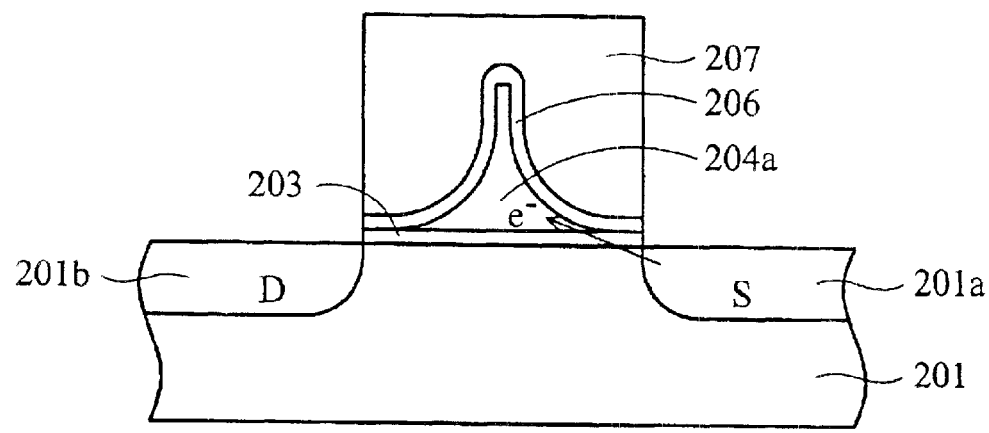
FIG. 3a depicts the programming operation of the flash memory of the present invention.

Next, a detail description of the programming operation of a flash memory with a protruded floating gate of the present invention is given hereafter with reference to FIG. 3a.

As shown in FIG. 3a, a structure of the flash memory with a protruded floating gate of the present invention is comprised of a substrate 201, a gate oxide 203 forming on the substrate 201, a protruded floating gate 204a forming on the gate oxide 203, a inter-gate oxide 206 forming on the protruded floating gate 204a, and a control gate 207 forming on the inter-gate oxide. The substrate 201 has a source 201a and a drain 201b.

When a high voltage is applied to the control gate 207 of the flash memory as shown in FIG. 3a of the present invention, the electrons from the source 201a are injected into the protruded floating gate 204a through the gate oxide 203, thereby programming the flash memory, e.g. information is written into the flash memory.

When a low voltage or no voltage is applied to the control gate 207 of the flash memory, and a high voltage is applied to the source 201a, the electrons are injected into the control gate 207 through the inter-gate oxide 206, thereby erasing the flash memory.

Figure 3B:
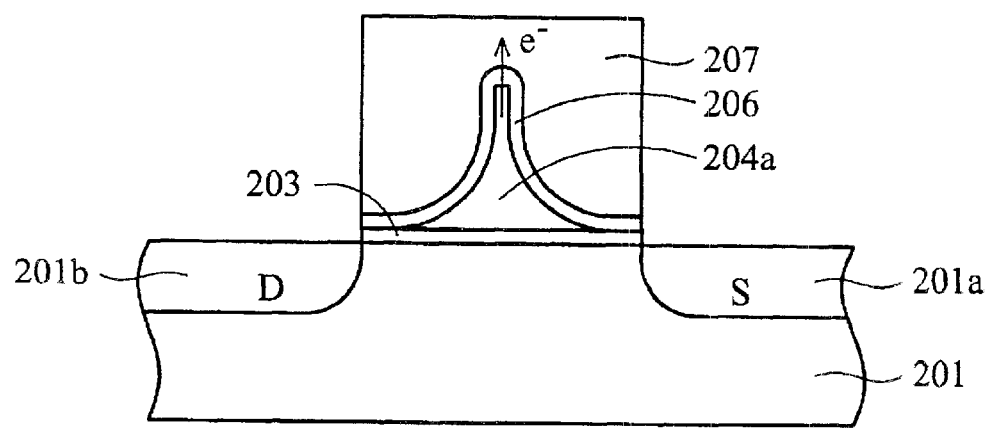
FIG. 3b depicts the erasing operation of the flash memory of the present invention.

The protruded floating gate 204a is tip-shaped or plateau-shaped. Because the electric field is more concentrated in the tip-shaped floating gate or the plateau-shaped floating gate, the electrons tunnel to the control gate 207 through the protruded floating gate 204a, and the protruded floating gate 204a is returned to the original state, as shown in FIG. 3b.

The flash memory of the present invention allows for a novel way of erasing which reduces the numbers of times of the electron tunnel through the gate oxide of the structure. Thus, the life of the gate oxide is extended, increasing the lifetime of the flash memory.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A method of forming a flash memory with a protruded floating gate, comprising the steps of:

providing a substrate;

sequentially forming an isolation area and a plurality of patterned conductive layers on the substrate, wherein the isolation area protrudes from the upper surface of the substrate to isolate the patterned conductive layers;

forming a photo resist layer on at least one of the patterned conductive layers, wherein the surface area of the photo resist layer is smaller than that of the corresponding of the patterned conductive layer;

isotropically etching the patterned conductive layers to form a protruded floating gate;

removing the photo resist layer; and sequentially forming an insulator and a control gate on the substrate.

2. The method of forming a flash memory with a protruded floating gate according to claim 1, wherein the isolation area is STI (Shallow Trench Isolation).

3. The method of forming a flash memory with a protruded floating gate according to claim 1, wherein the insulator is inter-gate oxide.

* * * * *